US007746964B2

(12) United States Patent
Nakano

(10) Patent No.: US 7,746,964 B2
(45) Date of Patent: Jun. 29, 2010

(54) SIGNAL PROCESSING APPARATUS AND SIGNAL PROCESSING METHOD

(75) Inventor: Kenji Nakano, Kanagawa (JP)

(73) Assignee: Sony Corporation, Tokyo (JP)

( * ) Notice: Subject to any disclaimer, the term of this patent is extended or adjusted under 35 U.S.C. 154(b) by 811 days.

(21) Appl. No.: 11/633,218

(22) Filed: Dec. 4, 2006

(65) Prior Publication Data

US 2007/0133823 A1 Jun. 14, 2007

(30) Foreign Application Priority Data

Dec. 13, 2005 (JP) .............................. 2005-359394

(51) Int. Cl.
*H04B 1/06* (2006.01)
*H04B 7/00* (2006.01)
(52) U.S. Cl. ...................... 375/345; 375/344; 375/358; 455/232.1; 455/233.1; 455/241.1; 455/240.1
(58) Field of Classification Search ................................
370/240.26–240.28, 284, 285, 297, 296, 370/317, 318, 344, 345, 358; 455/232.1–234.1, 455/239.1–242.1, 245.1, 245.2, 250.1, 249.1
See application file for complete search history.

(56) References Cited

U.S. PATENT DOCUMENTS

| 5,506,910 A | * | 4/1996 | Miller et al. ................. 381/103 |
| 5,627,896 A | * | 5/1997 | Southward et al. ........ 381/71.11 |
| 5,627,899 A | * | 5/1997 | Craven et al. .................. 381/98 |
| 5,644,596 A | * | 7/1997 | Sih ............................. 375/232 |
| 5,991,417 A | * | 11/1999 | Topholm ....................... 381/60 |

(Continued)

FOREIGN PATENT DOCUMENTS

EP 0119645 A 9/1984

(Continued)

OTHER PUBLICATIONS

Mueller, Swen et al.: "Transfer-Function Measurement with Sweeps," Journal of the Audio Engineering Society, Audio Engineering Society, Jun. 2001, pp. 443-471, vol. 49, No. 6, New York, New York.

(Continued)

*Primary Examiner*—David C Payne
*Assistant Examiner*—Linda Wong
(74) *Attorney, Agent, or Firm*—Wolf, Greenfield & Sacks, P.C.

(57) ABSTRACT

A signal processing apparatus includes a plurality of equalizer each used for a corresponding frequency band, controller for setting a gain value in each of the plurality of equalizer, and signal processor for processing an input signal by means of the plurality of equalizer. The controller determines a target gain value for each of the plurality of frequency bands, obtains a value of gain leakage from the first frequency band to a second frequency band adjacent to the first frequency band, updates a gain value set for the second frequency band, updates a gain value set for the first frequency band, repeats an update process for updating the gain value for each of the first frequency band and the second frequency band in an alternate manner until the gain value satisfies a predetermined condition, and sets the updated gain value for each of the frequency bands in the corresponding equalizer.

10 Claims, 10 Drawing Sheets

U.S. PATENT DOCUMENTS

| | | | |
|---|---|---|---|
| 6,366,613 B2 * | 4/2002 | Sommer et al. | 375/232 |
| 6,917,823 B2 * | 7/2005 | Katagishi et al. | 455/571 |
| 7,257,385 B2 * | 8/2007 | Ono et al. | 455/232.1 |
| 2001/0043650 A1 * | 11/2001 | Sommer et al. | 375/232 |
| 2002/0103619 A1 * | 8/2002 | Bizjak | 702/180 |
| 2002/0171476 A1 * | 11/2002 | Yamamoto | 330/10 |
| 2002/0191779 A1 * | 12/2002 | Pham | 379/406.08 |
| 2004/0014448 A1 * | 1/2004 | Talbot | 455/278.1 |
| 2004/0146170 A1 | 7/2004 | Zint | |
| 2005/0189990 A1 * | 9/2005 | Mizuta et al. | 330/52 |
| 2005/0254564 A1 * | 11/2005 | Tsutsui | 375/229 |
| 2006/0019627 A1 * | 1/2006 | Talbot | 455/296 |
| 2006/0153391 A1 | 7/2006 | Hooley et al. | |
| 2007/0082617 A1 * | 4/2007 | McCallister | 455/63.1 |
| 2007/0230556 A1 | 10/2007 | Nakano | |
| 2008/0189065 A1 | 8/2008 | Asada et al. | |
| 2008/0260170 A1 | 10/2008 | Nakano | |

FOREIGN PATENT DOCUMENTS

| | | |
|---|---|---|
| EP | 0898364 A | 2/1999 |
| EP | 1786241 A2 | 5/2007 |
| JP | 58-202619 | 11/1983 |
| JP | 03-006467 A | 1/1991 |
| JP | 05-327656 A | 12/1993 |
| JP | 8-047079 | 2/1996 |
| JP | 08-248077 A | 9/1996 |
| JP | 08-292179 A | 11/1996 |
| JP | 11-112254 | 4/1999 |
| JP | 2000-097762 A | 4/2000 |
| JP | 2001-25100 | 1/2001 |
| JP | 2001-212100 A | 8/2001 |
| JP | 2001-212101 A | 8/2001 |
| JP | 2001-217665 | 8/2001 |
| JP | 2002-354599 A | 12/2002 |
| JP | 2004-7245 | 1/2004 |
| JP | 2005-175562 | 6/2005 |
| JP | 2006-005902 A | 1/2006 |
| JP | 2006-516373 A | 6/2006 |
| WO | WO 2007-078254 A2 | 7/2007 |

OTHER PUBLICATIONS

Small, Richard H.: "Measurement of Loudspeaker Amplitude Modulation Distorsion," 114th Convention of the Audio Engineering Society, Mar. 2003, pp. 1-8, Amsterdam, The Netherlands.

* cited by examiner

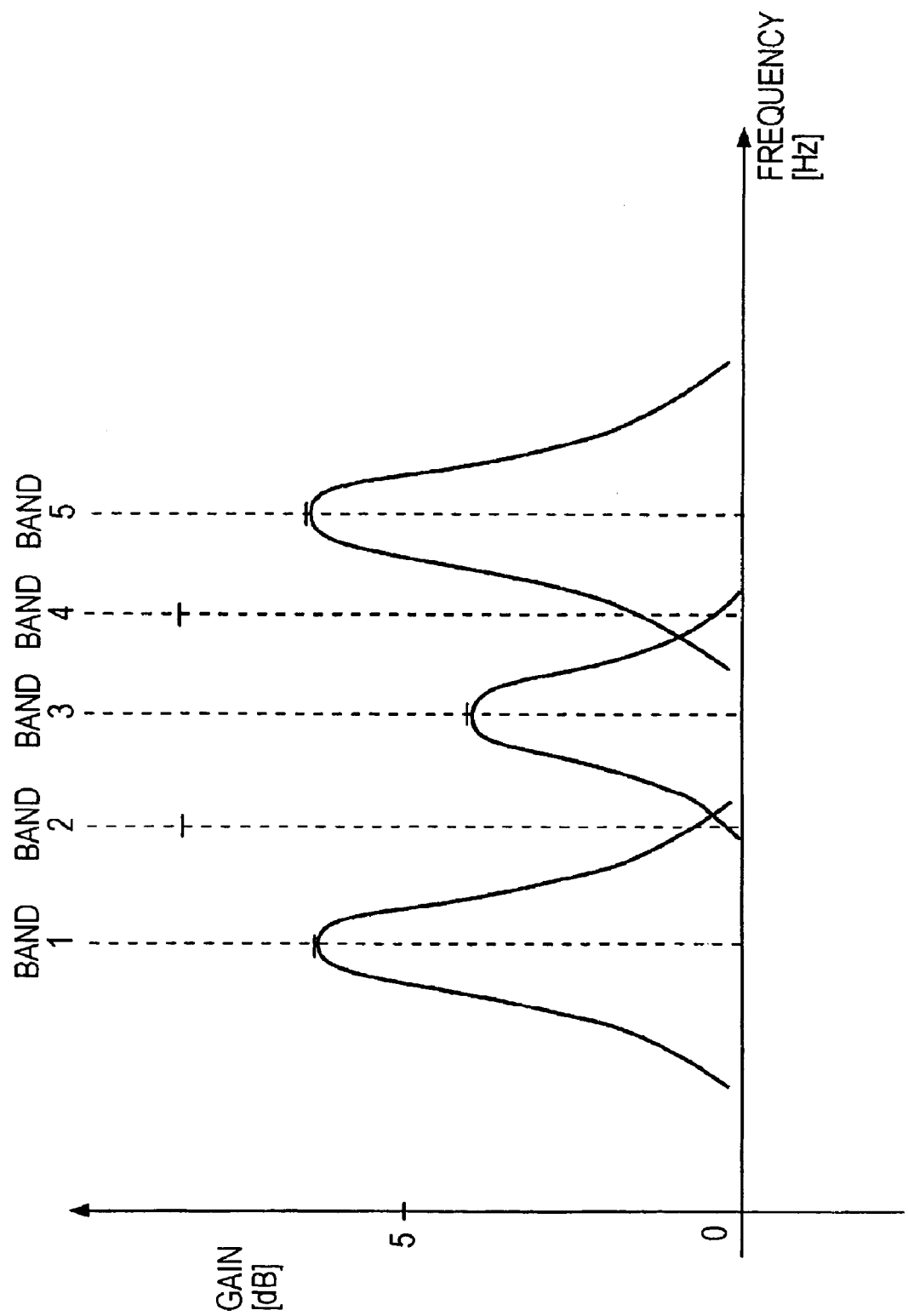

FIG. 7

| BAND | 1 | GAIN LEAKAGE | 2 | GAIN LEAKAGE | 3 | GAIN LEAKAGE | 4 | GAIN LEAKAGE | 5 |
|---|---|---|---|---|---|---|---|---|---|
| TARGET VALUE | 6 | | 8 | | 4 | | 8 | | 6 |
| FIRST STEP | 6 | ↘ 3 | | ↗ 2 | 4 | ↙ 2 | | ↘ 3 | 6 |
| FIRST SET | 4.5 | ↗ 1.5 | (5) 3 | ↗ 1.5 | (3) 1 | ↗ 1.5 | (5) 3 | ↘ 1.5 | 4.5 |
| SECOND SET | 3.4 | ↖ 2.25 | (2.75) 5.25 | ↙ 0.5 | | ↙ 0.5 | (2.75) 5.25 | ↖ 2.25 | 3.4 |
| | | ↙ 2.6 | | ↙ 2.6 | (5.2) −1.2 | ↙ 2.6 | | ↙ 2.6 | |
| THIRD SET | 2.55 | ↘ 1.7 | (1.1) 6.9 | ↙ −0.6 | | ↙ −0.6 | (1.1) 6.9 | ↘ 1.7 | 2.55 |
| | | ↗ 3.45 | | ↗ 3.45 | (6.9) −2.9 | ↗ 3.45 | | ↗ 3.45 | |
| FOURTH SET | 1.9 | ↗ 1.27 | (−0.18) 8.18 | ↗ −1.45 | | ↗ −1.45 | (−0.18) 8.18 | ↗ 1.27 | 1.9 |
| | | ↘ 4.1 | | ↗ 4.1 | (8.2) −4.2 | ↗ 4.1 | | ↗ 4.1 | |
| CALCULATED VALUE | | ↘ 0.95 | | ↗ −2.1 | | ↗ −2.1 | | ↘ 0.95 | |

⇩ −0.15     ⇩ −0.15

ACTUAL GAINS FOR BAND 2 AND BAND 4 →

⇧ 3+2.75=5.75

⇧ 5.25+1.1=6.35

⇧ 6.9−0.2=6.7

⇧ 8.18−0.15=8.03

SIGNAL PROCESSING APPARATUS AND SIGNAL PROCESSING METHOD

CROSS REFERENCES TO RELATED APPLICATIONS

The present invention contains subject matter related to Japanese Patent Application JP 2005-359394 filed in the Japanese Patent Office on Dec. 13, 2005, the entire contents of which are incorporated herein by reference.

BACKGROUND OF THE INVENTION

1. Field of the Invention

The present invention relates to signal processing apparatuses and methods for performing gain control so that a target gain can be obtained for each of a predetermined number of frequency bands of an input signal.

2. Description of the Related Art

In the related art, a known example of an effecter for changing a frequency-amplitude characteristic of an audio signal is a graphic equalizer (GEQ). One known example of such a GEQ has an operation element for each equalizer element which can be operated by a user to set a gain for a corresponding frequency band.

In recent years, a GEQ including an automatic sound-field correcting function in which various sound-field corrections, such as correction of a frequency-amplitude characteristic, are performed automatically has been used in, for example, a car audio system or a home audio visual (AV) system.

In this system, a microphone is set at a listening position in advance, a test signal output from a speaker is picked up by the microphone, and the frequency-amplitude characteristic thereof is measured on the basis of the picked-up test signal. Signal processing is performed on an audio signal on the basis of the measurement result so that a target frequency-amplitude characteristic can be obtained. Specifically, gains set to equalizer elements for corresponding frequency bands are controlled so that the target characteristics can be obtained by using the above-described GEQ, for example.

Japanese Unexamined Patent Application Publication No. 8-047079, for example, discloses the related art.

SUMMARY OF THE INVENTION

When a GEQ is used for the correction of the frequency-amplitude characteristic as described above, correction of a gain for each of a plurality of bands to obtain a target characteristic may be difficult.

For example, in a typical GEQ, a Q (quality) factor for each equalizer element may be set to a comparatively lower value so that valley-shaped portions between pairs of synthesized gains of adjacent bands in a so-called EQ curve is considerably prevented from forming. Since the Q factor is set to a lower value as described above, as shown in FIG. 4A, a characteristic (form) of a gain window for each band tends to be a bell-shaped curve having long tails spreading from a center frequency. Therefore, as shown in the shaded portion in FIG. 4B, leaking (overlapping) of gain occurs between bands adjacent to each other. Since such gain leakage (overlapping of gain) is generated, even when a certain gain value is set for each band, a gain value larger than the certain gain value is actually obtained. In other words, when a target gain value obtained from the result of simple measurement is merely set, a target characteristic is not properly obtained.

Accordingly, in use of a GEQ for the correction of the frequency-amplitude characteristic, when gain leakage between adjacent bands is generated because of a measure taken to considerably prevent valley-shaped portions between pairs of synthesized gains of adjacent bands in a so-called EQ curve from forming, it is difficult to properly correct the frequency-amplitude characteristic to obtain the target characteristic.

In addition, as described above, the automatic sound-field correction process for correcting the frequency-amplitude characteristic is performed on the basis of the picked-up test signal. Specifically, the automatic sound-field correction process is performed before a normal audio-reproduction process. The longer the automatic sound-field correction process takes, the longer a user has to wait. This leads to a system having a poor usability.

According to am embodiment of the present invention, there is provided a signal processing apparatus includes a plurality of equalizing means each used for a corresponding frequency band among a plurality of frequency bands, controlling means for setting a gain value in each of the plurality of equalizing means, and signal processing means for processing an input signal by means of the plurality of equalizing means. The controlling means determines a target gain value for each of the plurality of frequency bands, obtains, when the target gain value is set for a first frequency band among the plurality of frequency bands, a value of gain leakage from the first frequency band to a second frequency band adjacent to the first frequency band, updates a gain value set for the second frequency band in accordance with the value of gain leakage to the second frequency band and the target gain value for the second frequency band, updates a gain value set for the first frequency band in accordance with a value of gain leakage to the first frequency band from the second frequency band when the updated gain value is set for the second frequency band and the target gain value for the first frequency band, repeats an update process for updating the gain value for each of the first frequency band and the second frequency band in an alternate manner until the gain value satisfies a predetermined condition, and sets the updated gain value for each of the frequency bands in the corresponding equalizing means.

With this configuration, in at least bands adjacent to each other, a gain value in a first band is updated taking gain leakage from a second band into consideration. Then, the gain value in the first band is further updated taking gain leakage from the second band after the updated gain value in the first band is set into consideration. This process is sequentially repeated.

Since the gain value is repeatedly updated as described above, the values of gain leakage are changed mutually between the adjacent bands. In this process, an error between an actual gain value and a target value is reduced and an actual characteristic is gradually approximated to a target characteristic. That is, the repetitive update process of the gain value approximates more accurately an actual gain characteristic to a target characteristic.

According to the embodiment of the present invention, gain control is performed so that a target gain characteristic is properly obtained when gain is leaked to the adjacent band(s).

Furthermore, according to the embodiment of the present invention, in an update process, comparatively simple calculation to obtain a gain value to be set in a band is repeatedly performed taking a value of gain leakage from the adjacent band(s) into consideration. Accordingly, the calculation takes comparatively short time.

In this way, a process for controlling an actual gain characteristic to obtain a target characteristic when gain leakage is generated takes a comparatively short time. Consequently, a

BRIEF DESCRIPTION OF THE DRAWINGS

FIG. 6 is a graph illustrating a value of a set target gain for each band as an example;

FIG. 7 is a diagram illustrating reduction of error components by repeatedly updating a gain value, in which a gain value update process is illustrated by transitions of a calculated gain value and a value of gain leakage for each band;

DESCRIPTION OF THE PREFERRED EMBODIMENTS

A best mode (herein after referred to as a preferred embodiment) for carrying out the present invention will be described hereinafter.

Figure 1:
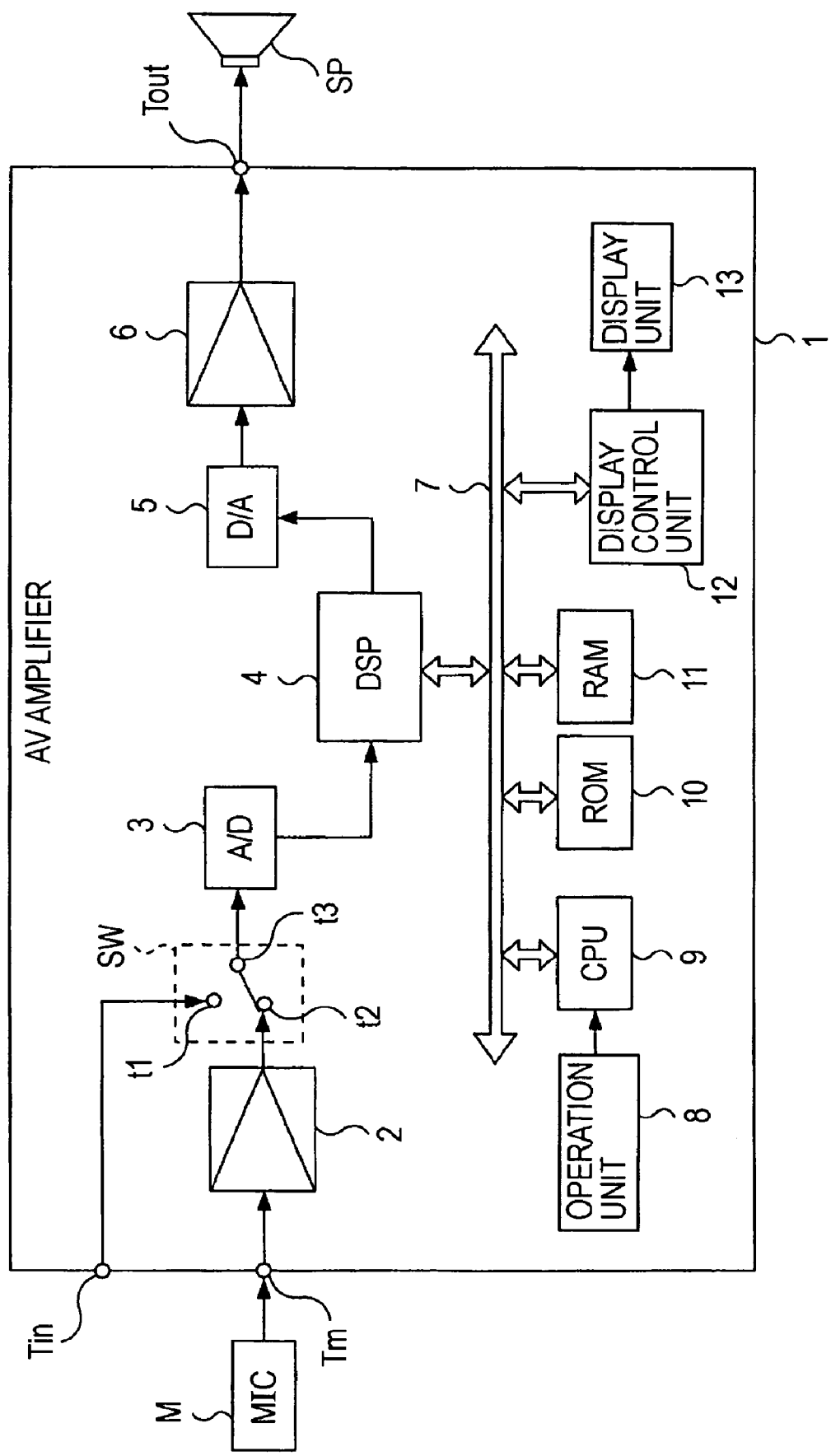
FIG. 1 is a block diagram showing an internal configuration of an AV amplifier having a signal processing apparatus according to an embodiment of the present invention.

FIG. 1 shows an internal configuration of an AV amplifier 1 having a signal processing apparatus according to an embodiment of the present invention.

The AV amplifier 1 includes an automatic sound-field correcting function for automatically performing various sound-field corrections such as a correction of a frequency-amplitude characteristic by an AV system.

Figure 2:
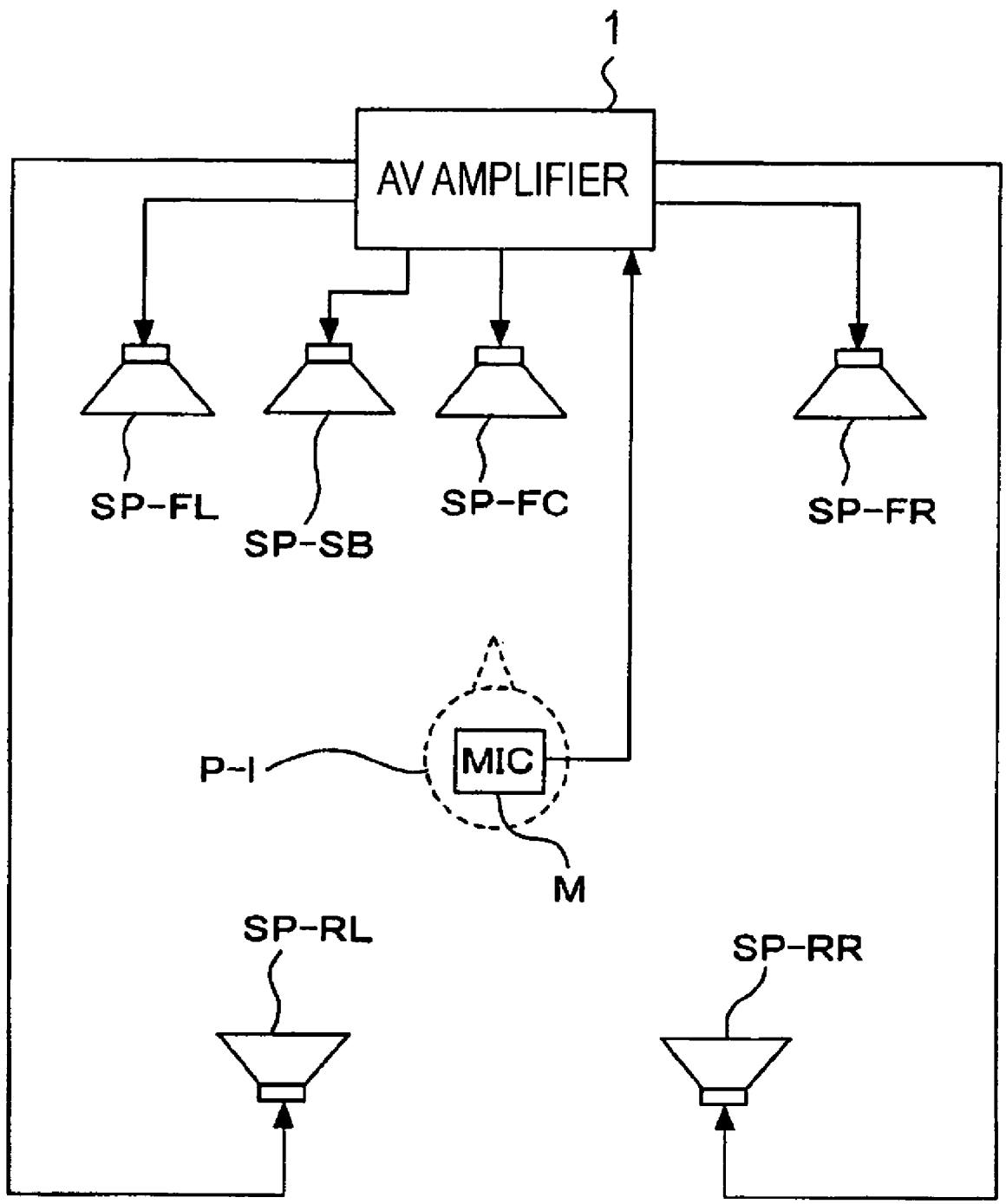
FIG. 2 is a diagram showing a configuration of an AV system including the AV amplifier according to the embodiment, the AV amplifier having speakers and a microphone.

FIG. 2 is a schematic diagram showing a configuration of the AV system including the AV amplifier 1 for implementing such an automatic sound-field correcting function. FIG. 2 illustrates the AV system as a 5.1 channel surround system. As shown in the figure, six speakers are connected to the AV amplifier 1, that is, a front-center speaker SP-FC, a front-right speaker SP-FR, a front-left speaker SP-FL, a rear-right speaker SP-RR, a rear-left speaker SP-RL, which are five channel speakers, and a sub woofer SP-SB.

In addition, a microphone M necessary for measurement of an acoustic characteristic is set at a listening position P-1 and is connected to the AV amplifier 1.

In FIG. 1, the six speakers SPs (the speakers SP-FC, SP-FR, SP-FL, SP-RR, SP-RL, and SP-SB) are shown as a speaker SP for simplicity. The speaker SP is connected to an audio-output terminal Tout in the AV amplifier 1 as shown in FIG. 1.

The microphone M shown in FIG. 2 is connected to a microphone-input terminal Tm.

The AV amplifier 1 includes an audio-input terminal Tin as shown in FIG. 1 in addition to the microphone-input terminal Tm and an external audio signal is input through the audio-input terminal Tin.

A switch SW is provided for switching an input audio signal. The switch SW alternatively selects a terminal t1 or a terminal t2 to be connected to a terminal t3 shown in FIG. 1. The audio-input terminal Tin is connected to the terminal t1 and the microphone-input terminal Tm is connected to the terminal t2 through a microphone amplifier 2. An A/D converter 3 is connected to the terminal t3.

According to this configuration when the terminal t1 is selected, an audio signal can be input externally through the audio-input terminal Tin, and when the terminal t2 is selected, an audio signal can be input from the microphone M through the microphone-input terminal Tm.

Although not shown in the figure, a central processing unit (CPU) 9, which will be described later, controls the switch SW to input an audio signal from the microphone M at the time of measurement of an acoustic characteristic (in this case, particularly, measurement of a frequency-amplitude characteristic).

The audio signal is converted to a digital signal in the A/D converter 3, and the digital signal is input to a digital signal processor (DSP) 4. The DSP 4 performs various audio-signal processes for input audio signals.

An example of such audio-signal processes is a process for producing various acoustic effects such as a reverberant effect.

The DSP 4 in this embodiment measures a frequency-amplitude characteristic and a delay time between each of the speakers SPs and the microphone M, which are measurements for various acoustic characteristics necessary for automatic sound-field correction. Such measurement is performed as follows. A test signal such as a time stretched pulse (TSP) signal is output from the speaker SP and thereafter detected by the microphone M. The acoustic characteristic is measured on the basis of a detected result.

The DSP 4 performs such an operation of the measurement of the acoustic characteristic in response to a command from the CPU 9. This configuration is well known and the detailed description thereof is omitted herein.

In addition, the DSP 4 in this embodiment is a graphic equalizer (GEQ) having a plurality of equalizer elements and controls gains for each of a plurality of frequency bands.

Each of the equalizer elements included in the DSP 4 is a digital filter called a mid presence filter (MPF).

Figure 3:
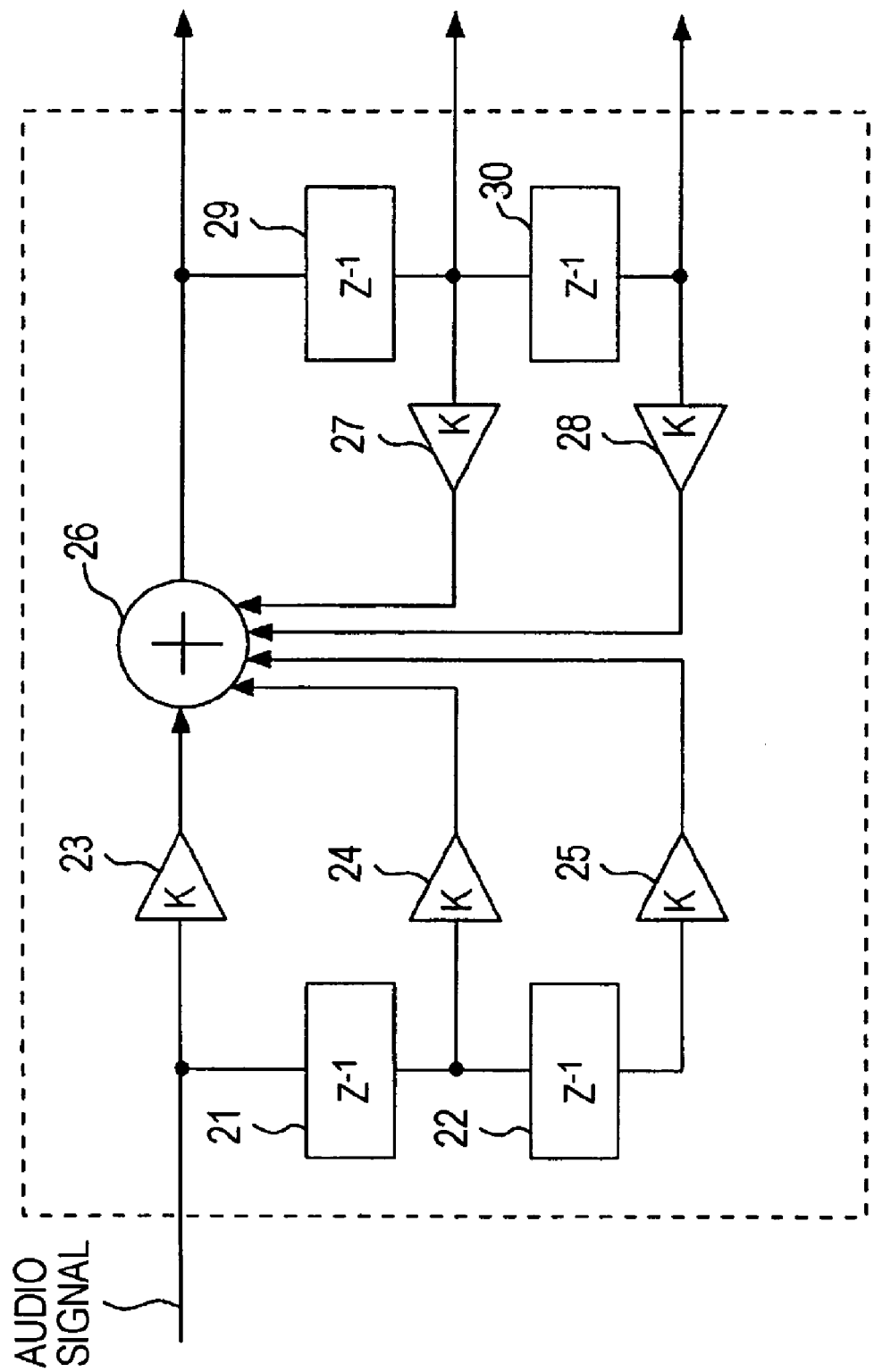
FIG. 3 is a block diagram showing an example of configuration of an equalizer element included in the signal processing apparatus according to the embodiment.

FIG. 3 is a block diagram showing a configuration of components of the equalizer element formed by the MPF. As shown in FIG. 3, the MPF includes delay elements 21, 22, 29 and 30, multipliers 23, 24, 25, 27 and 28, and an adder 26.

An audio signal shown in FIG. 3 is input to the adder 26 through the multiplier 23, and the audio signal is also input to the adder 26 through the delay element 21 and the multiplier 24. Similarly, the audio signal transmitted through the delay element 21 is also input to the adder 26 through the delay element 22 and the multiplier 25.

The adder 26 outputs a signal after arithmetic addition and the signal is branched. One of the branched signals is output to the outside and the other is re-input into the adder 26 through the delay element 29 and the multiplier 27 as shown in FIG. 3.

Note that the MPF shown in FIG. 3 serves as an equalizer element (frequency band). For example, a GEQ having 31 bands has 31 stages of MPFs connected in series. In this GEQ, the delay elements 29 and 30 also function as delay elements 21 and 22 for an MPF in the next band. That is, signals output from the delay elements 29 and 30 are input to an adder 26 through multipliers 24 and 25 in the next-band MPF. The adder 26 in the next-band MPF also receives a signal output from the adder 26 in the previous-band MPF.

In such an MPF, the CPU 9, which will be described later, gives multiplier coefficients to the multipliers 23, 24, 25, 27 and 28. A gain for each frequency band can be varied in accordance with the coefficient of the corresponding multiplier, and in addition, a Q factor and a center frequency for each of the frequency bands can be varied in accordance with the coefficient of the corresponding multiplier.

The DSP 4 implements a digital filter process as such an MPF by performing numerical calculation in accordance with program control.

In FIG. 1, an audio signal is subjected to an audio signal process in the DSP 4, converted into an analog signal in a D/A converter 5, and then amplified in an amplifier 6 to be supplied to the audio-output terminal Tout.

In FIG. 1, the CPU 9 includes a read only memory (ROM) 10 and a random access memory (RAM) 11 and controls the entire AV amplifier 1.

The CPU 9 communicates with units through the bus 7 shown in FIG. 1 to control each of the units. As shown in FIG. 1, the ROM 10, the RAM 11, a display control unit 12, and the DSP 4 are connected to the CPU 9 through the bus 7.

The ROM 10 connected to the CPU 9 stores operation programs and various coefficients used by the CPU 9, for example. The RAM 11 is used as a workspace for the CPU 9.

An operation unit 8 is connected to the CPU 9.

The operation unit 8 includes various operation elements which are disposed so as to be exposed to the outside of a housing of the AV amplifier 1. The operation unit 8 supplies a command signal in response to an operation of the operation element to the CPU 9. The CPU 9 performs various types of control in response to the command signal. Accordingly, the AV amplifier 1 performs various processes in response to operations input by a user.

The operation unit 8 may include a command-receiving unit for receiving a command signal input as an infrared signal, for example, supplied from a remote commander. Specifically, the command-receiving unit receives the command signal supplied from the remote commander in response to the operation and supplies the command signal to the CPU 9.

The operation unit 8 includes an operation element for controlling a gain for each equalizer element (for each frequency band) in a GEQ.

The user operates the operation element and instructs to input a gain value to be set for each of the frequency bands. The CPU 9 supplies an instructed value to the DSP 4 in accordance with the operation input, to thereby control a gain according to the instructed value so that the gain is set as a gain for a corresponding equalizer element.

The CPU 9 issues a command to the display control unit 12 to control display of contents of a display unit 13. The display unit 13 is a display device such as a liquid crystal display (LCD). The display control unit 12 controls the display unit 13 to drive it in accordance with contents of the command issued by the CPU 9. Thus, the display unit 13 performs screen display in accordance with the command issued by the CPU 9.

It is understood from the foregoing description that the AV amplifier 1 of this embodiment corrects a frequency-amplitude characteristic by means of a GEQ. When the GEQ is used for the correction of the frequency-amplitude characteristic, it may be difficult to correct a gain for each band so that a target characteristic can be obtained.

Figure 4A:
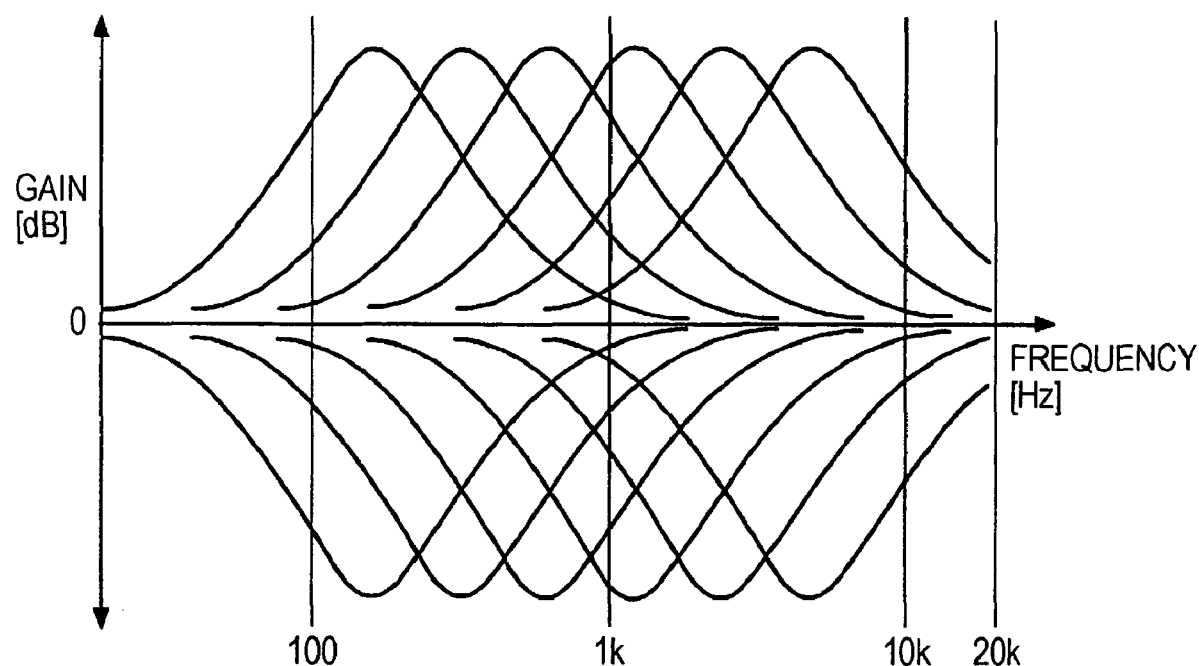
FIGS. 4A and 4B are graphs illustrating gain leakage.
Figure 4B:
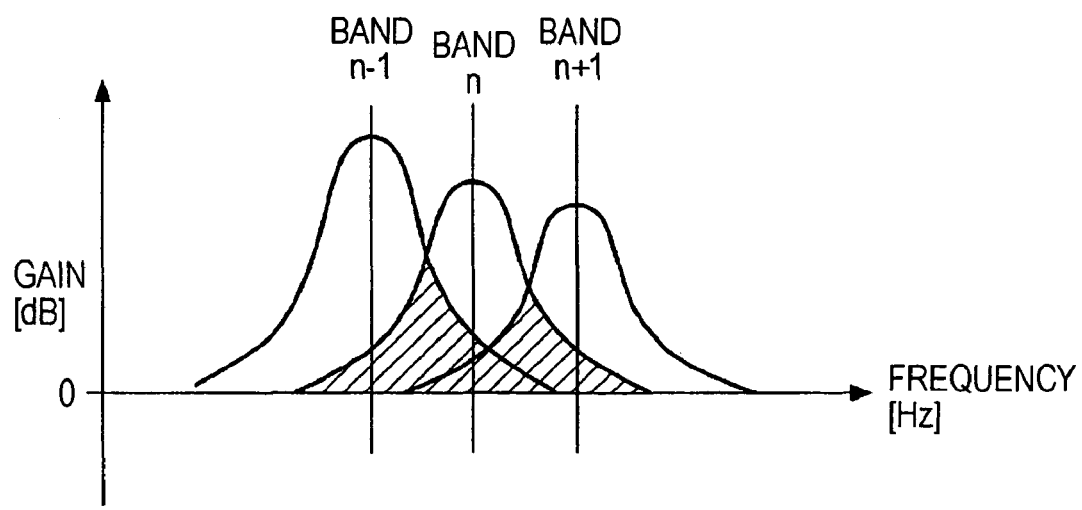

For example, a Q factor of each equalizer may be set comparatively lower so that valley-shaped portions between pairs of synthesized gains of adjacent bands in a so-called EQ curve is considerably prevented from forming. In this case, as shown in FIG. 4A, a characteristic (form) of a gain window for each band tends to be a bell-shaped curve having long tails spreading from a center frequency. Therefore, as shown in the shaded portion in FIG. 4B, leakage of gain occurs between bands adjacent to each other. Specifically, as shown in FIG. 4B, the band n is influenced by gain leakage from a band n−1 and a band n+1, both adjacent to the band n, whereas the band n−1 and the band n+1 are influenced by gain leakage from the band n.

Since such gain leakage is generated, even when a certain gain value is set for each band, a gain value larger than the certain gain value is actually obtained. In other words, when a target gain value obtained from a result of simple measurement is merely set, a target characteristic is not substantially obtained.

Accordingly, in a case where a GEQ is used for the correction of the frequency-amplitude characteristic, when gain leakage between adjacent bands is generated because of a measure taken to considerably prevent valley-shaped portions between pairs of synthesized gains of adjacent bands in a so-called EQ curve from forming, it is difficult to properly correct the frequency-amplitude characteristic to obtain the target characteristic.

To address the above problems, in this embodiment, even when gain leakage is generated between adjacent bands, a frequency-amplitude characteristic can be properly corrected to obtain a target characteristic and a gain is controlled for each frequency band.

A frequency-amplitude characteristic is corrected, provided that a target characteristic is set on the basis of a measured frequency-amplitude characteristic. In addition to this, in this embodiment, the frequency-amplitude characteristic is corrected so that the characteristic (form) is to be flat all over the frequency bands.

Figure 5A:
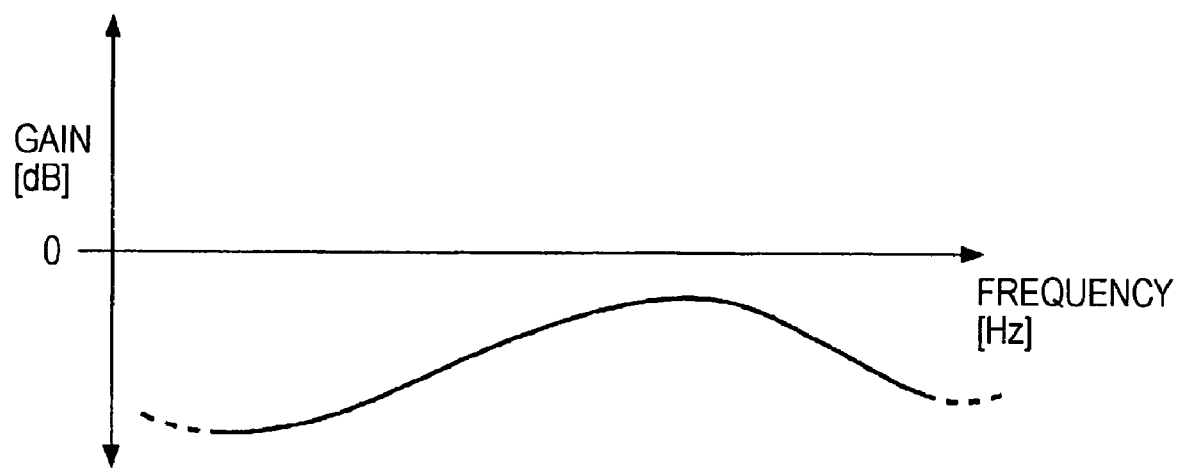
FIGS. 5A and 5B are graphs illustrating the relationship between a frequency-amplitude characteristic and a target gain characteristic.
Figure 5B:
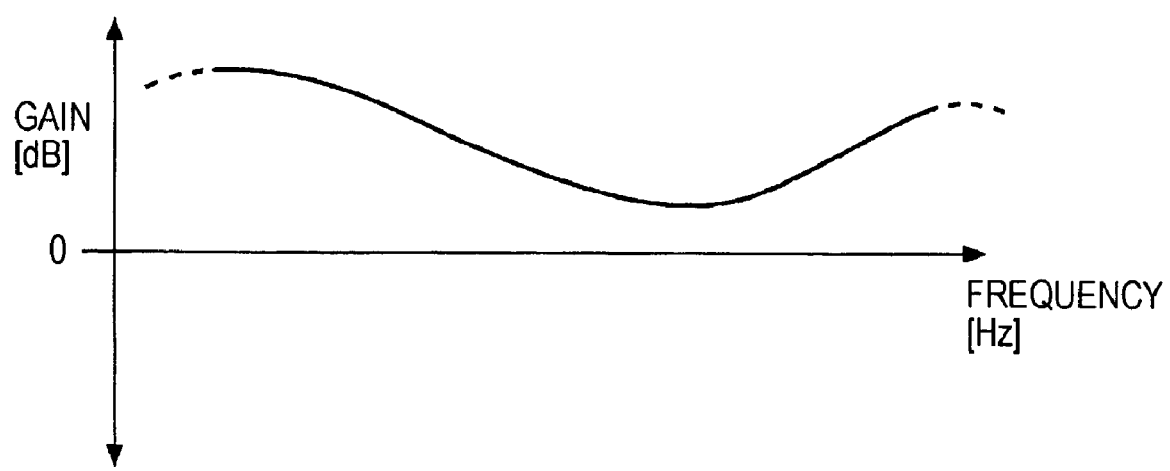

For example, when a frequency-amplitude characteristic shown in FIG. 5A is obtained, a gain characteristic shown in FIG. 5B which cancels an amplitude for each band in FIG. 5A is set so that the characteristic becomes flat. Specifically, a value obtained by inverting the polarity of an amplitude value at the center frequency for each band is set.

FIG. 6 is a graph illustrating an example of a value of a target gain for each band. The target gain value is set in accordance with a result of measurement of a frequency-amplitude characteristic.

For simplicity, in FIG. 6 and the following description, each band is influenced only by gains of adjacent bands. Specifically, a frequency band n is influenced only by gain leakage from a frequency band n−1 and a frequency band n+1, both adjacent to the band n.

Note that a range influenced by the gain leakage is a range influenced by the gain leakage when a gain value in a center frequency is set to be maximum.

For further simplicity, the GEQ has five bands in the following description.

In FIG. 6, as a result of the measurement of frequency-amplitude characteristic, it is assumed that amplitude values (dB) of center frequencies for bands 1 to 5 are band 1=−6, band 2=−8, band 3=−4, band 4=−8, and band 5=−6.

Target gain values (dB) at the center frequencies of the bands set in accordance with these values are as shown in FIG. 6: band 1=6, band 2=8, band 3=4, band 4=8, and band 5=6.

According to the foregoing description, preset values are not obtained as actual gain values for bands which are influenced by gain leakage from one another. In contrast, bands which are not influenced by gain leakage from one another can obtain estimated preset values as gain values as long as each of the gain values is set for the corresponding band.

For gain control in this case, a target gain value of a center frequency for each of the bands which are not influenced by gain leakage from one another is tentatively determined. In this embodiment, since the gain leakage of a band has influence on only adjacent bands, the target gain value is tentatively determined for every other band.

Here, as shown in FIG. 6, first, a target gain value for each odd-numbered band (band 1, band 3, and band 5) is tentatively determined.

Once the target gain values at the center frequencies of the odd-numbered bands are determined, values of gain leakage from the odd-numbered bands to even-numbered bands can be estimated.

When each of the gain values in the corresponding center frequency is determined, (provided that a Q factor is fixed to a certain value), a form of a gain window of the band can be determined and hence the value of the gain leakage to the adjacent bands can be determined in accordance with the form of the gain window.

Specifically, the gain leakage to the adjacent bands can be determined in accordance with the gain value at the center frequency in the following manner. A table of data listing the relationships between gain values at the center frequencies and values of gain leakage is created, for example. Each time a gain value in a center frequency is determined, a value of gain leakage corresponding to the determined gain value is read out from the table. Alternatively, the value of the gain leakage can be obtained by calculation using a function indicating the relationship between a gain value at the center frequency and a value of gain leakage.

The value of the gain leakage from the adjacent band (odd-numbered band) is estimated in this manner, whereby a gain value to be set for obtaining a target gain value in a center frequency of an even-numbered band can be estimated.

For example, assuming that a total value of gain leakage from bands 1 and 3 into band 2 be 5 dB, the target gain value in a center frequency in band 2 is 8 dB. Accordingly, the gain value to be set at the center frequency for obtaining the target value is estimated as 3 dB derived from the following equation: 8 dB−5 dB=3 dB.

The gain value to be set at the center frequency to each of the even-numbered bands is estimated in this manner, whereby a value of gain leakage to each odd-numbered bands can be estimated. Furthermore, on the basis of the value of the gain leakage, a gain value to be set for obtaining a target gain value in a center frequency of each of the odd-numbered bands can be estimated. In short, the above-described value tentatively determined can be replaced by a value obtained in accordance with the value of the gain leakage from the even-numbered band.

The gain value at the center frequency in each of the odd-numbered bands is updated by being replaced by the value obtained in accordance with the value of the gain leakage in the corresponding even-numbered band(s) in this manner, whereby the values of the gain leakage to the even-numbered bands are updated. Accordingly, the gain values to be set at the center frequencies in the even-numbered bands are further updated. Similarly, when the gain value at the center frequency in each of the even-numbered bands is updated, the gain value at the center frequency to be set in the corresponding odd-numbered band(s) is updated. Furthermore, the gain value in each of the even-numbered bands is updated in accordance with the updated gain value in the corresponding odd-numbered bands. In this way, the gain values to be set at the center frequencies are sequentially updated in an alternate manner such as an order starting from even-numbered bands alternately followed by odd-numbered bands and even-numbered bands while each of the values of the gain leakage in the corresponding band is considered.

An update process for the gain values described above is considered. The gain value in each of the odd-numbered bands determined first is tentatively determined without consideration of gain leakage from the even-numbered bands. Accordingly, the estimated gain value in each of the even-numbered bands estimated on the basis of the value of gain leakage obtained on the basis of such a tentative value includes an error, that is, the estimated gain value is different from an actual gain value to be set.

Then, the gain value in each of the odd-numbered bands is updated in accordance with the gain leakage from the corresponding even-numbered band(s), and furthermore, the gain value in each of the even-numbered bands is updated in accordance with the gain leakage updated in accordance with the updated gain value in the corresponding odd-numbered band(s). Since the gain value in the even-numbered band is originally set on the basis of the tentative value in the odd-numbered band, an error component is included in each update value.

Note that the error component becomes smaller by repeatedly updating the gain value in an order starting from odd-numbered bands alternately followed by even-numbered bands and odd-numbered bands and so on. Consequently, an overall gain characteristic of the bands becomes closer to the target characteristic gradually.

FIG. 7 is a diagram illustrating reduction of an error component by repeatedly updating the gain value. For simplicity, in FIG. 7, each value of gain leakage to adjacent elements is set to be a half of a gain value in a center frequency.

A target value for each band is shown in FIG. 7. In this embodiment, as described above with reference to FIG. 6, the target gain values (dB) at the center frequencies in the band 1 to band 5 are band 1=6, band 2=8, band 3=4, band 4=8, and band 5=6.

Transition of estimated values (update value) at the center frequencies for the bands are shown as "calculated values" in FIG. 7. In addition, transition of the value of gain leakage to adjacent bands for each of the bands in accordance with the update value is shown between the bands in FIG. 7.

As shown in FIG. 7, in the "first step", a target gain value in a center frequency in each of the odd-numbered bands is tentatively determined. That is, in this embodiment, the target gain values are tentatively determined as follows: band 1=6, band 3=4, and band 5=6. The gain values are tentatively determined in this manner, whereby values of gain leakage of the odd-numbered bands to even-numbered bands can be estimated. Specifically, a value of gain leakage (dB) from band 1 is "3", a value of gain leakage from band 3 is "2", and a value of gain leakage from band 5 is "3".

In this embodiment, a process of updating the gain values of the even-numbered bands and the gain values of the odd-numbered bands after the gain values of the odd-numbered bands are tentatively determined in the "first step" is set as one set. As shown in FIG. 7, four sets of update processes are repeatedly performed.

In a first set, values of gain leakage based on the tentative values in the odd-numbered bands are estimated, whereby gain values to be set in center frequencies in the even-numbered bands can be estimated. Specifically, band 2 is influenced by values of gain leakage from bands 1 and 3 and the total value (dB) of the gain leakage is "5". Since the target gain value is "8", the equation 8 dB−5 dB=3 dB is calculated. Similarly, band 4 is influenced by values of gain leakage from bands 3 and 5 and the total value of the gain leakage is "5". Since the target gain value is "8", the equation 8 dB−5 dB=3 dB is calculated.

The gain values at the center frequencies in the even-numbered bands are estimated in this manner, whereby values of gain leakage to adjacent odd-numbered bands can be estimated. Specifically, the gain value at the center frequency in bands 2 and 4 is 3. Accordingly, the value of gain leakage to adjacent odd-numbered bands from bands 2 and 4 is "1.5".

On the basis of the value of the gain leakage, a gain value to be set at the center frequency in each of the odd-numbered bands is updated. That is, band 1 is influenced by the value of the gain leakage of "1.5" from band 2. Since the target gain value in band 1 is "6", the equation 6 dB−1.5 dB=4.5 dB is calculated. Band 3 is influenced by the total value (1.5 dB+1.5 dB=3 dB) of gain leakage from bands 2 and 4. Since the target gain value is "4", the equation 4 dB−3 dB=1 dB is calculated. Band 5 is influenced by the value of the gain leakage of "1.5" from band 4. Since the target gain value in band 1 is "6", the equation 6 dB−1.5 dB=4.5 dB is calculated.

In this manner, the gain values to be set at the center frequencies in the odd-numbered bands are updated, whereby the values of the gain leakage from the odd-numbered bands to the even-numbered bands are updated. Specifically, the value (dB) of the gain leakage from band 1 is "2.25", the value of the gain leakage from band 3 is "0.5", and the value of the gain leakage from band 5 is "2.25".

In a second set, since band 2 is influenced by the total value (2.75 dB) of gain leakage from bands 1 and 3, a gain value of 5.25 dB at the center frequency of band 2 is calculated and the center frequency is updated by being replaced by this value. Similarly, band 4 is influenced by the total value (2.75 dB) of gain leakage leaked from bands 3 and 5, a gain value of 5.25 dB at the center frequency of band 4 is calculated and the center frequency is updated by being replaced by this value.

Values of gain leakage from bands 2 and 4 to the odd-numbered bands in accordance the update values are both 2.6 dB. In accordance with these values, the center frequency of band 1 is updated to 3.4 dB, the center frequency of band 3 is updated to −1.2 dB, and the center frequency of band 5 is updated to 3.4 dB. In this case, although the precise value of the gain leakage from each of the even-numbered bands is 2.625 dB, the value is rounded off to one decimal place for simplicity.

In a third set, values of gain leakage obtained in accordance with the update values of band 1, band 3, and band 5 are band 1=1.7 dB, band 3=−0.6, band 5=1.7 dB. Update values for the even-numbered bands calculated from the values of gain leakage are both 6.9 dB (in accordance with a total value of gain leakage of 1.1 dB from the odd-numbered bands).

Furthermore, values of gain leakage obtained in accordance with the update values of the even-numbered bands are all 3.45 dB. According to the values of gain leakage, an update value in band 1 is 2.55 dB, an update value in band 3 is −2.9 dB, and an update value in band 5 is 2.55 dB.

In a fourth set, values of gain leakage obtained in accordance with the update values in band 1, band 3, and band 5 in the third set are band 1=1.27 dB (rounded off to the hundredth), band 3=−1.45 dB, and band 5=1.27 dB (rounded off to the hundredth). Accordingly, update values of the even-numbered bands calculated from the values of gain leakage are both 8.18 dB (in accordance with a total value of gain leakage of −0.18 dB from the odd-numbered bands).

Values of gain leakage obtained in accordance with the update values of the even-numbered bands are all 4.1 dB (rounded off to one decimal place). According to the values of gain leakage, an update value in band 1 is 1.9 dB, an update value in band 3 is −4.2 dB, and an update value in band 5 is 1.9 dB.

An update process for updating one set is considered next. First, the gain values in the even-numbered bands are estimated, whereby the values of gain leakage to the odd-numbered bands are updated. Then, update values in the odd-numbered bands are calculated taking the values of gain leakage into consideration so that target gain values are obtained. Obviously, actual gain values obtained when the update values are set at this point are the same as the target gain values. According to the update process in this embodiment, the gain values actually obtained in the odd-numbered bands are the same as the target gain values.

On the other hand, since in the odd-numbered bands the update values are calculated such that the actual gain values are the same as the target gain values, in the even-numbered bands the gain values actually obtained are different from the target gain values. When a process for the first set is terminated, since the set value (update value) is 3 dB and the total value of gain leakage from the adjacent odd-numbered bands is 2.75 (2.25+0.5) dB, gain values actually obtained in the even-numbered bands are 5.75 dB, which is not same as the target value of 8 dB.

It is understood that an error between each of the gain values actually obtained and the corresponding target value in the even-numbered band is reduced gradually by repeatedly performing the update process. Specifically, the gain value actually obtained in each of the even-numbered bands when the second set is terminated is 6.35 dB since the set value is 5.25 dB and the total value of the gain leakage from the adjacent odd-numbered band(s) is 1.1 dB. Furthermore, the gain value actually obtained in each of the even-numbered bands when the third set is terminated is 6.7 dB since the set value is 6.9 dB and the total value of the gain leakage from the adjacent odd-numbered band(s) is −0.2 dB. Moreover, the gain value actually obtained in each of the even-numbered bands when the fourth set is terminated is 8.03 dB since the set value is 8.18 dB and the total value of the gain leakage from the adjacent odd-numbered band(s) is −0.15 dB.

In this way, since the update process for the gain values is repeatedly performed while taking the gain leakage into consideration, the gain characteristic can be approximated to the target characteristic. Consequently, even when bands are influenced by gain leakage from the corresponding adjacent band(s), the gain value in each of the bands can be controlled so that all gain characteristics become the target characteristics.

Furthermore, the method of this embodiment is implemented by repeatedly performing a predetermined number of times a process for calculating the gain value of each of the bands in accordance with the gain leakage from the corresponding adjacent band(s) and the target gain value. Specifically, the calculation process is a comparatively simple arithmetic process including at least addition and subtraction. Accordingly, a gain control process in this embodiment takes a comparatively short time.

Consequently, when the gain leakage to the adjacent band(s) is generated, a process for controlling an actual gain to obtain a target gain takes a comparatively short time, and accordingly, the user has to wait shorter time. This efficiently suppresses deterioration of usability of a system.

In FIG. 7, a minimum unit of a controllable gain value is set to be 0.01 dB. On the basis of the result of an experiment, however, it was confirmed that when the minimum unit of the controllable gain value is set to be 0.5 dB, the gain is approximated to the target characteristic most closely after performing four sets of the update process. The number of times the update process should be performed to most closely approximate the gain characteristic to the target characteristic varies in accordance with a set minimum unit of the controllable gain value. In this case also, the number of times the update process should be performed to most closely approximate the gain to the target characteristic is determined, and the update process is repeated a corresponding number of times. Accordingly, the gain in each of the bands can be similarly controlled to be most closely approximated to the target characteristic.

Figure 8:
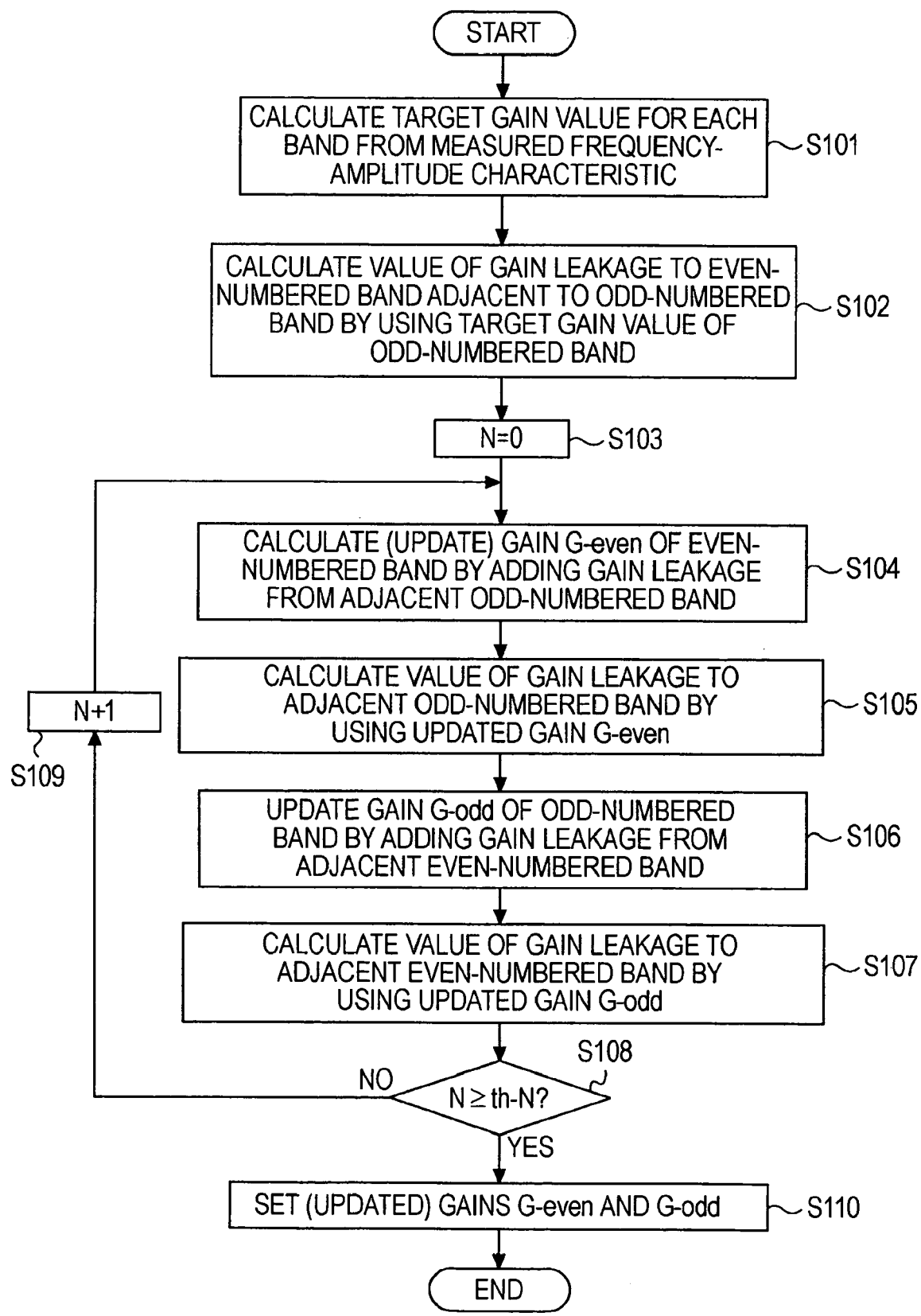
FIG. 8 is a flowchart illustrating a processing operation to be executed to implement a gain control process according to the embodiment.

FIG. 8 is a flowchart illustrating a process to be executed for implementation of a gain control process according to the embodiment.

The process illustrated in FIG. 8 is performed by the CPU 9 in accordance with a program stored in the ROM 10. The frequency-amplitude characteristic used in the process illustrated in FIG. 8 is measured before performing the process.

In FIG. 8, a target gain value for each band is calculated by using a measurement result of the frequency-amplitude characteristic in step S101. In this embodiment, since the frequency-amplitude characteristic is flat over all the frequency bands as described above, a value obtained by inverting the polarity of an amplitude value at the center frequency for each of the bands obtained as a result of the measurement is set as a target gain value at the center frequency in each of the bands.

In step S102, values of gain leakage to the corresponding adjacent even-numbered band(s) are calculated from the target gain values of the odd-numbered bands. Note that the values of the gain leakage can be obtained by calculation using a function indicating the relationship between a gain value at the center frequency and a value of gain leakage. Alternatively, the values of the gain leakage can be obtained by referring to table information indicating the relationship between a gain value at the center frequency and a value of gain leakage.

In step S103, a count value N is reset to 0. The count value N is used for counting the number of times the update process from steps S104 to S108 for updating gain values, which will be described later, is performed.

In step S104, a value of a gain G-even in each of the even-numbered bands is calculated (updated) taking a value(s) of gain leakage from the corresponding adjacent odd-numbered band(s) into consideration.

In an update process (calculation process) performed in step S104, when a center frequency in each of the bands is set to n, an update value G[n] can be obtained by using the following equation, $$G[n]=-(Trgt[n]+LG[n-1]+LG[n+1]),$$

where Trgt[n] denotes an amplitude value of the center frequency n obtained from a measured frequency characteristic, LG[n−1] denotes a value of gain leakage from a band having a center frequency n−1 to the center frequency band n, and LG[n+1] denotes a value of gain leakage from a band having a center frequency n+1 to the center frequency band n.

For example, in FIG. 7, the update value G[n] of 3 dB in band 2 in the first set is obtained from the calculation G[n]=−(−8+3+2)=3 derived from following values: an amplitude value Trgt[n]=−8; a value of gain leakage LG[n−1] from a band having a center frequency of n−1 (i.e., band 1)=3; a value of gain leakage LG[n+1] from a band having a center frequency of n+1 (i.e., band 3)=2.

In step S105, a value of gain leakage to an adjacent odd-numbered band(s) is calculated by using the updated gain G-even.

In step S106, a gain value G-odd in each of the odd-numbered bands is updated taking the value of gain leakage from the adjacent even-numbered band(s) into consideration. In an update process (calculation process) performed in step S106, when a center frequency in each of the bands is set to n as in step S104, an update value G[n] can be obtained using the following equation, $$G[n]=-(Trgt[n]+LG[n-1]+LG[n+1]),$$

where Trgt[n] denotes an amplitude value of the center frequency n obtained from a measured frequency characteristic, LG[n−1] denotes a value of gain leakage from a band having a center frequency n−1 to the center frequency band n, and LG[n+1] denotes a value of gain leakage from a band having a center frequency n+1 to the center frequency band n.

In step S107, a value of gain leakage to the adjacent even-numbered band(s) is calculated by using the updated gain G-odd.

In step S108, it is determined whether or not the count value N is not less than a threshold value th-N. The threshold value th-N is set in the CPU 9 in advance for defining the number of times the update process should be performed. In this embodiment, "4" is set as the threshold value.

In step S108, when the determination is negative, which means the count value N is less than the threshold value th-N, the process advances to step S109 where the count value N is incremented by 1, and thereafter the process returns to step S104. In this way, the update process for updating the gain value is performed the predetermined number of times.

In step S108, when the determination is affirmative, which means that the count value N is not less than the threshold value th-N, the process advances to step S110 where the updated gain G-even and the updated gain G-odd are set. The CPU 9 instructs the DSP 4 to set coefficients for the bands in the corresponding multipliers (23, 24, 25, 27, and 28) in the corresponding equalizer elements so that the updated gain values finally obtained in the update process are set as gain values at the center frequencies in the corresponding bands.

Thereby, the gain value at the center frequency in each of the bands is adjusted to be the gain value obtained in the update process.

In the description hereinabove, each band is influenced by gain leakage only from the adjacent band(s). However, even when each band is influenced by gain leakage from a band(s) two bands or more away from the band, a gain can be controlled similarly to have a target characteristic by performing a process according to the method described above.

As an example, a process to be performed when each band is influenced by gain leakage from a band(s) two bands or more away from the band is described.

Figure 9:
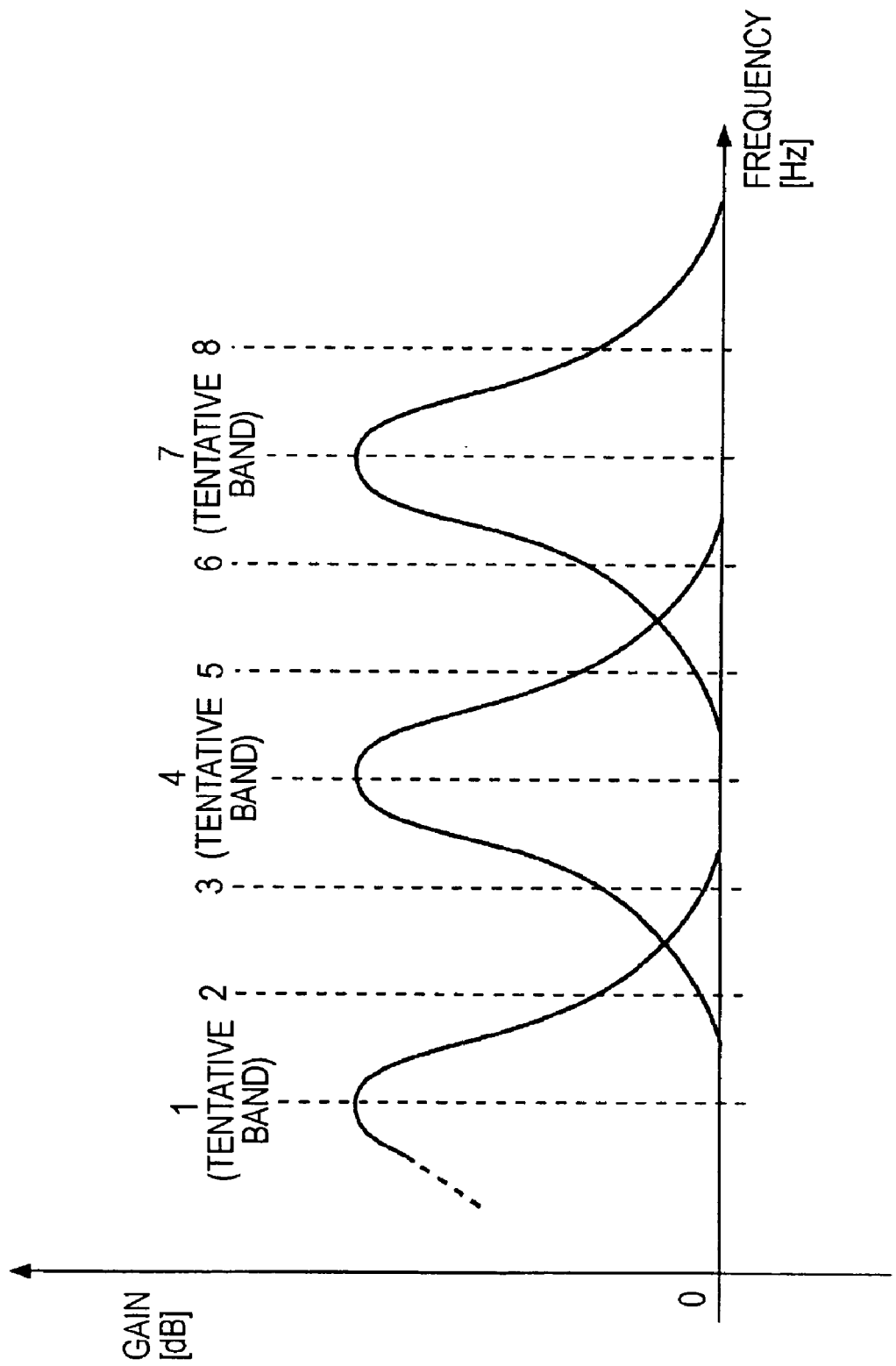
FIG. 9 is a diagram illustrating the gain control process when a band is influenced by gain leakage from a band two bands or more away from the band, in which target gain values are tentatively determined for bands (tentative bands) which are not influenced by gain leakage from one another.

When a band of interest is influenced by gain leakage from a band(s) two bands or more away from the band of interest, the band of interest is not influenced by gain leakage from a band three bands or more away from the band of interest, in other words. As shown in FIG. 9, since gain leakage of a band three bands or more away from a band of interest does not affect the band of interest, it is assumed that a target gain value of the band three bands or more away from the band of interest can be obtained. In this case, gain values at the center frequency of every third band can be tentatively set as target gain values.

In the description hereinafter, each of bands set every third band and to which a target gain value can be tentatively set without consideration of gain leakage is called as a "tentative band".

For example, in FIG. 9, it is assumed that the number of bands is eight, and band 1, band 4, and band 7 among the eight bands from band 1 to band 8 are set as tentative bands.

As described above, after the target values are tentatively determined for the tentative bands, gain values for other bands are estimated as follows.

Note that a band to the immediate right of each of the tentative bands is named a "tentative+1 band" and a band to the immediate right of the "tentative+1 band" is named a "tentative+2 band". It is assumed that since a gain value of each tentative+2 band is not estimated, gain leakage from the tentative+2 band is not considered. A gain value of each of the tentative+1 bands is estimated by only taking the gain leakage from the corresponding tentative band into consideration.

Since the gain values in the tentative band and the tentative+1 band are estimated as described above, a gain value in the tentative+2 band is estimated taking the gain leakage from the tentative band and the tentative+1 band into consideration.

According to the above description, when the gain values in the tentative band and the tentative+1 band are estimated (calculated) for the first time, gain leakage from a band(s) by which the tentative band and the tentative+1 band are influenced is not taken into consideration. Accordingly, the gain values in the tentative band and the tentative+1 band are tentatively set as gain values. Referring to FIG. 7, the first calculation of the gain values in the tentative band and the tentative+1 band corresponds to the calculation of the gain values in "first step".

On the other hand, when the gain value in the tentative+2 band is estimated, gain leakage from all bands by which the tentative+2 band is influenced is taken into consideration. At this point, the estimation of the gain value in the tentative+2 band corresponds to the calculation of the gain value in the even-numbered bands in the first set.

Specifically, the first set of the update process is started with the calculation of the gain value in the tentative+2 band.

Then, a process for updating gain values of the tentative+2 band, the tentative band, and the tentative+1 band as one set is repeatedly performed taking gain leakage into consideration.

Specifically, the gain value in the tentative band is updated to obtain an actual gain value which is the same as a target value taking the gain leakage from the tentative+1 band and the tentative+2 band into consideration. The gain value in the tentative+1 band is updated to obtain an actual gain value which is the same as a target value taking the gain leakage from the tentative band and the tentative+2 band into consideration. The gain value in the tentative+2 band is updated to obtain an actual gain value which is the same as a target value taking the gain leakage from the tentative band and the tentative+1 band into consideration.

Note that when each band is influenced only by the gain leakage from the adjacent band(s) as described in FIG. 7, the actual gain value in each of the tentative bands (i.e., the odd-numbered bands) is the same as the target value. However, in this case, since a band of interest is influenced by the gain leakage from bands two bands away from the band of interest, the actual gain in the band of interest is not determined by the relationship between the band of interest and the immediately adjacent band(s), but the actual gain in the band of interest is determined by the relationship between the band of interest, the immediately adjacent band(s), and the band two bands away from the band of interest. Accordingly, the gain value of each of the bands does not completely match the target value.

As with the process in FIG. 7, in this case also, the update process for the gain values is repeatedly performed, whereby an error between the actual gain value and the target value in each of the bands is reduced. In this case also, after the gain values are updated the predetermined number of times in accordance with minimum control units set for the gain values, the error is minimized. Accordingly, an actual gain characteristic is approximated to a target characteristic in each of the bands.

In this way, the gain values are updated the predetermined number of times, whereby the gain can be controlled to obtain actual gain characteristics which are the same as target characteristics.

Figure 10:
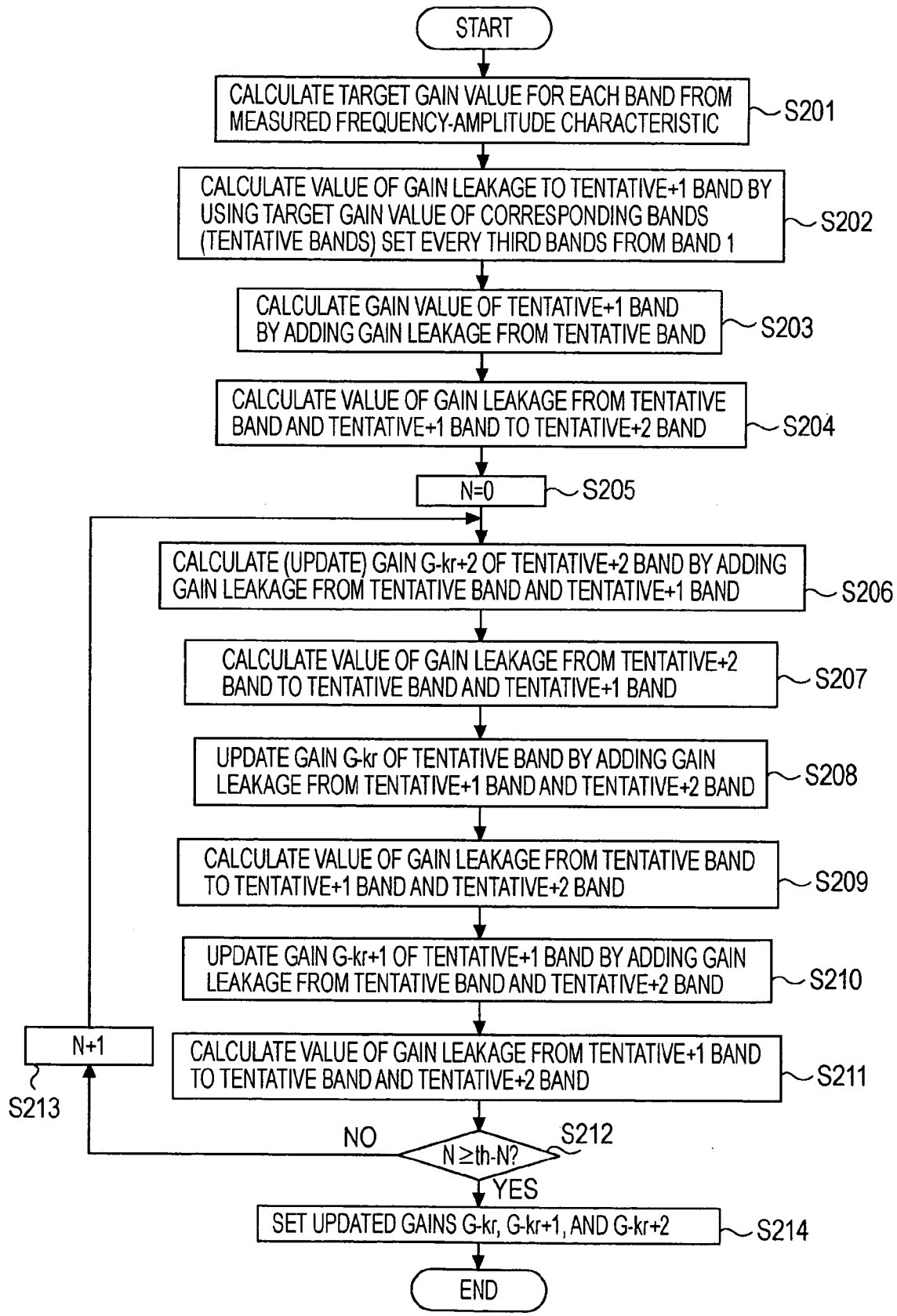
FIG. 10 is a flowchart illustrating a processing operation to be executed to implement a gain control process when a band is influenced by gain leakage from a band two bands or more away from the band.

FIG. 10 illustrates a process to be executed for implementing the above-described gain control process. Note that the process in FIG. 10 is performed by the CPU 9 in accordance with a program stored in the ROM 10. The frequency-amplitude characteristic used in the process illustrated in FIG. 10 is measured before performing the process.

In step S201, a target gain value for each band is calculated by using a measured frequency-amplitude characteristic as in step S101 illustrated in FIG. 8.

In step S202, values of gain leakage to the tentative+1 bands and the tentative+2 bands are calculated by using target gain values of corresponding bands (tentative bands) set as every third band from band 1.

In step S203, a gain value in each of the tentative+1 bands is calculated by adding the gain leakage from the corresponding tentative band. In step S204, values of gain leakage from the tentative band and the tentative+1 band to the corresponding tentative+2 band are calculated. Specifically, a value of the gain leakage to the tentative+2 band obtained in accordance with the gain value in the tentative band calculated in step S201 is calculated. In addition, a value of the gain leakage to the tentative+2 band obtained in accordance with the gain value in the tentative+1 band calculated in step S203 is calculated.

In step S205, a count value N is reset to 0. The count value is used for counting the number of times the update process for updating gain values is performed.

In step S206, a value of a gain G-kr+2 in the tentative+2 band is calculated (updated) taking values of gain leakage from the tentative band and the tentative+1 band into consideration.

In an update process (calculation process) performed in step S206 and the subsequent steps S208 and S210, when a center frequency in each band is set to n, an update value G[n] can be obtained by using the following equation, $$G[n] = -(Trgt[n] + LG[n-2] + LG[n-1] + LG[n+1] + LG[n+2]),$$

where Trgt[n] denotes an amplitude value of the center frequency n obtained from the measured frequency characteristic, LG[n−1] denotes a value of gain leakage from a band having a center frequency n−1 to the center frequency band n, LG[n−2] denotes a value of gain leakage from a band having a center frequency n−2 to the center frequency band n, LG[n+

1] denotes a value of gain leakage from a band having a center frequency n+1 to the center frequency band n, and LG[n+2] denotes a value of gain leakage from a band having a center frequency n+2 to the center frequency band n.

In this case, since a band of interest is influenced by a band(s) two bands away from the band of interest, the number of terms in the equation expressing the gain leakage is increased when compared with the equation explained with reference to FIG. 8.

In step S207, values of gain leakage to the tentative band and the tentative+1 band from the tentative+2 band are calculated in accordance with the updated gain value G-kr+2.

In step S208, a gain value G-kr in the tentative band is updated taking the values of gain leakage from the tentative+1 band and tentative+2 band into consideration. In step S209, values of the gain leakage from the tentative band to the tentative+1 band and tentative+2 band are calculated.

In step S210, a gain value G-kr+1 in the tentative+1 band is updated taking the values of the gain leakage from the tentative band and the tentative+2 band into consideration. In step S211, values of the gain leakage from the tentative+1 band to the tentative band and the tentative+2 band are calculated.

In step S212, it is determined whether or not the count value N is not less than a threshold value th-N. The threshold value th-N is set in the CPU 9 in advance for prescribing the number of times the update process is to be performed. In this case, the number of times the update process is to be performed in order to approximate an actual gain characteristic to a target characteristic is set to the threshold value th-N, on the basis of a result of an experiment performed in advance, for example.

In step S212, when the determination is negative, which means that the count value N is less than the threshold value th-N, the process advances to step S213 where the count value N is incremented by 1, and thereafter the process returns to step S206. In this way, the update process for the gain value is performed the predetermined number of times.

In step S212, when the determination is affirmative, which means that the count value N is not less than the threshold value th-N, the process advances to step S214 where the updated gain G-kr, the updated gain G-kr+1, and the updated gain G-kr+2 are set. The CPU 9 instructs the DSP 4 to set coefficients in the bands in the corresponding multipliers (23, 24, 25, 27, and 28) in the corresponding equalizer elements so that the updated gain values finally obtained in the update process are set as gain values at the center frequencies in the corresponding bands.

Thereby, the gain value at the center frequency in each of the bands is adjusted to be the gain value obtained in the update process.

It can be understood from the above description that when bands of interest are influenced by gain leakage of a band(s) two bands away from the bands of interest, target values are tentatively determined in tentative bands (that is, bands which are separated from one another so that the is bands are not influenced by gain leakage of one another). A gain value of each of the bands following the tentative band is calculated in an order starting from the tentative+1 band, the tentative+2 band, and so on taking gain leakage obtained in accordance with the tentatively determined values into consideration. Note that since gain leakage from all bands by which the bands of interest are influenced is not considered to obtain the gain values calculated for the corresponding bands, the gain values are tentatively determined values.

Then, an update process is started with calculation of gain values in bands, such as the tentative+2 bands in the foregoing example where values of gain leakage from all bands by which the bands of interest are influenced are estimated. For example, when the bands of interest are influenced by gain leakage of a corresponding band(s) three bands away from the bands of interest, a gain value of each of the tentative band, tentative+1 band, and the tentative+2 band is estimated taking gain leakage by which each of the tentative band, the tentative+1 band, and the tentative+2 band is influenced into consideration. Thereafter, in an order starting with a tentative+3 band, the tentative band, the tentative+1 band, the tentative+2 band, and so on, the gain value of each of the bands is updated taking gain leakage from the adjacent band, a band two bands away from the band of interest, and a band three bands away from the band of interest into consideration.

In this way, after the gain values are updated the predetermined number of times, errors of the update values are gradually reduced. Accordingly, an actual gain characteristic is approximated to a target characteristic in each of the bands.

Note that although gain control is performed when a band of interest is influenced by a band(s) two bands or more away from the band of interest, in this case also, a gain value taking gain leakage from the adjacent band(s) into consideration is updated. Specifically, gain control is performed on at least each of the bands adjacent to each other on the basis of a result of the updated gain value in accordance with a value of gain leakage from each other.

Although an embodiment of the present invention is described hereinabove, the present invention is not limited to this embodiment.

For example, although an operation of the signal processing apparatus in this embodiment is implemented by the CPU 9 and the DSP 4, the operation can be implemented by the DSP 4 by itself. In this case, the DSP 4 may perform a process shown in FIG. 8 (FIG. 10).

In this embodiment, gain values are updated the predetermined number of times. Alternatively, the gain values can be repeatedly updated until an error between an actual characteristic and a target characteristic becomes a predetermined value or less. In this case, a band to be subjected to detection of an error can be selected in a desired manner. Alternatively, an average value of errors in all bands can be set as a reference value.

As described earlier and shown in FIG. 7, when a band of interest is influenced by gain leakage from the adjacent band(s) and a gain value in each odd-numbered band is tentatively set to a corresponding target value in the first step, a value of an actual gain in each even-numbered band includes an error. Accordingly, the error between the value of the actual gain and the target value in each of the even-numbered bands is measured.

Furthermore, since the error is minimized when the update process has been performed the predetermined number of times, the error increases thereafter in an update process. Here, the error is measured each time the update process is finished. When the latest measured error is larger than the error measured in the previous update process, the update value obtained in the previous update process can remain as the update value.

In this embodiment, it is assumed that a Q factor and a center frequency in each band be fixed. However, the embodiment of the present invention can be applied to a so-called parametric equalizer in which a Q factor and a center frequency can be varied.

In this case, a value of gain leakage to another band is varied in accordance with the set Q factor and the center frequency. Accordingly, table information listing the relationships between the value of gain leakage and the combination of the Q factor and the center frequency which can be set can be prepared. Alternatively, values of gain leakage can be calculated by using functions for calculating the values of the gain leakage for the corresponding relationships between the Q factor and the center frequency which can be set.

In this way, a gain value in each band can be properly updated taking proper gain leakage in accordance with the set Q factor and the set center frequency into consideration.

It should be understood by those skilled in the art that various modifications, combinations, sub-combinations and alterations may occur, depending on design requirements and other factors insofar as they are within the scope of the appended claims or the equivalents thereof.

What is claimed is:

1. A signal processing apparatus comprising:
a plurality of equalizing means each used for a corresponding frequency band among a plurality of frequency bands;
controlling means for setting a gain value in each of the plurality of equalizing means; and
signal processing means for processing an input signal by means of the plurality of equalizing means,
wherein the controlling means
determines a target gain value for each of the plurality of frequency bands;
identifies one or more first frequency bands that are not influenced by gain leakage from one another and assigns a corresponding target gain value as a first gain value to each of the one or more first frequency bands;
for each first frequency band of the one or more first frequency bands:
obtains a value of gain leakage from the first frequency band to a second frequency band influenced by gain leakage from the first frequency band;
sets a second gain value for the second frequency band in accordance with the value of gain leakage to the second frequency band and the target gain value corresponding to the second frequency band;
updates the first gain value for the first frequency band in accordance with a value of gain leakage to the first frequency band from the second frequency band and the second gain value for the second frequency band;
updates the second gain value in accordance with the value of the gain leakage from the first frequency band to the second frequency band and the first gain value updated in the act of updating; and
to determine final gain values, repeats the acts of updating the first gain value for the first frequency band and updating the second gain value for the second frequency band until the first gain value and the second gain value satisfy a predetermined condition; and
sets a final gain value for each of the frequency bands of the plurality of frequency bands in the corresponding equalizing means.

2. The signal processing apparatus according to claim 1, wherein the controlling means stops the repeating after the updating the first gain value and the updating the second gain value have been performed a predetermined number of times.

3. The signal processing apparatus according to claim 1, wherein the controlling means stops the repeating when an error between the gain value and the target gain value in each of the frequency bands is smaller than a predetermined value.

4. A signal processing method for controlling a gain using equalizing means provided for each of a plurality of frequency bands, the signal processing method comprising:
determining a target gain value at a center frequency in each of the plurality of frequency bands;
identifying one or more first frequency bands that are not influenced by gain leakage from one another and assigning a corresponding target gain value as a first gain value to each of the one or more first frequency bands;
for each first frequency band of the one or more first frequency bands:
obtaining a value of gain leakage from the first frequency band to a second frequency band influenced by gain leakage from the first frequency band;
setting a second gain value for the second frequency band in accordance with the value of gain leakage to the second frequency band and the target gain value corresponding to the second frequency band;
updating the first gain value for the first frequency band in accordance with a value of gain leakage to the first frequency band from the second frequency band and the second gain value for the second frequency band;
updating the second gain value in accordance with the value of the gain leakage from the first frequency band to the second frequency band and the first gain value updated in the act of updating; and
to determine final gain values for the first frequency band and second frequency band, repeating the acts of updating the first gain value for the first frequency band and updating the second gain value for the second frequency band repeatedly until the first gain value and the second gain value satisfy a predetermined condition; and
setting final gain value in each of the frequency bands of the plurality of frequency bands.

5. The signal processing method according to claim 4, wherein the act of repeating stops when the acts of updating the first and second gain values have been performed a predetermined number of times.

6. The signal processing method according to claim 4, wherein the act of repeating stops when an error between the gain value and the target gain value in each of the frequency bands is smaller than a predetermined value.

7. A signal processing apparatus comprising:
a plurality of equalizer elements each used for a corresponding frequency band among a plurality of frequency bands;
a controller configured to set a gain value for each of the plurality of equalizer elements; and
a signal processor configured to process an input signal by means of the plurality of equalizer elements,
wherein the controller
determines a target gain value for each of the plurality of frequency bands;
identifies one or more first frequency bands that are not influenced by gain leakage from one another and assigns a corresponding target gain value as a first gain value to each of the one or more first frequency bands;
for each first frequency band of the one or more first frequency bands:
obtains a value of gain leakage from the first frequency band to a second frequency band influenced by gain leakage from the first frequency band;
sets a second gain value for the second frequency band in accordance with the value of the gain leakage to the second frequency band and the target gain value corresponding to the second frequency band;

updates the first gain value for the first frequency band in accordance with a value of gain leakage to the first frequency band from the second frequency band and the second gain value for the second frequency band;

updates the second gain value in accordance with the value of the gain leakage from the first frequency band to the second frequency band and the first gain value updated in the act of updating;

to determine final gain values, repeats the acts of updating the first gain value for the first frequency band and updating the second gain value for the second frequency band until the first gain value and the second gain value satisfy a predetermined condition; and sets a final gain value for each of the frequency bands of the plurality of frequency bands in the corresponding equalizing element.

8. The signal processing apparatus of claim 1, wherein the controlling means identifies the one or more first frequency bands that are not influenced by gain leakage from one another by identifying one or more first frequency bands having a value of gain leakage from one another below a specified level.

9. The signal processing method of claim 4, wherein identifying the one or more first frequency bands that are not influenced by gain leakage from one another comprises identifying one or more first frequency bands having a value of gain leakage from one another below a specified level.

10. The signal processing apparatus of claim 1, wherein the controller identifies the one or more first frequency bands that are not influenced by gain leakage from one another by identifying one or more first frequency bands having a value of gain leakage from one another below a specified level.

* * * * *